(12) United States Patent
Jo et al.

(10) Patent No.: US 8,272,826 B2
(45) Date of Patent: Sep. 25, 2012

(54) SUBSTRATE PROCESSING APPARATUS

(75) Inventors: Cheol Rae Jo, Seoul (KR); Jang-Wan Park, Yongin-si (KR); Won Ki Jeong, Seongnam-si (KR)

(73) Assignee: Advanced Display Process Engineering Co., Ltd, Seongnam-Si (KR)

( * ) Notice: Subject to any disclaimer, the term of this patent is extended or adjusted under 35 U.S.C. 154(b) by 637 days.

(21) Appl. No.: 12/144,680

(22) Filed: Jun. 24, 2008

(65) Prior Publication Data
US 2009/0035103 A1 Feb. 5, 2009

(30) Foreign Application Priority Data

Aug. 3, 2007 (KR) .................. 10-2007-0078078

(51) Int. Cl.
*H01L 21/677* (2006.01)
(52) U.S. Cl. ........................................ 414/217; 414/939
(58) Field of Classification Search .................. 414/217, 414/939
See application file for complete search history.

(56) References Cited

U.S. PATENT DOCUMENTS

| | | | | |
|---|---|---|---|---|
| 5,445,491 A * | 8/1995 | Nakagawa et al. | ........... | 414/805 |
| 5,695,564 A * | 12/1997 | Imahashi | ...................... | 118/719 |
| 5,846,328 A * | 12/1998 | Aruga et al. | .................. | 118/718 |
| 6,395,094 B1 * | 5/2002 | Tanaka et al. | ................. | 118/719 |
| 6,450,750 B1 * | 9/2002 | Heyder et al. | ................. | 414/217 |
| 6,571,729 B2 * | 6/2003 | Sasaki et al. | ............. | 118/723 R |
| 6,729,824 B2 * | 5/2004 | Lei et al. | ........................ | 414/217 |
| 6,939,403 B2 * | 9/2005 | Ivanov et al. | ................... | 118/52 |
| 7,025,554 B2 * | 4/2006 | Ozawa et al. | ................. | 414/217 |
| 7,198,448 B2 * | 4/2007 | Ozawa et al. | ................. | 414/217 |
| 7,622,006 B2 * | 11/2009 | Ishizawa et al. | ............. | 118/719 |
| 2005/0063799 A1 * | 3/2005 | Larson et al. | ................. | 414/217 |
| 2008/0232948 A1 * | 9/2008 | van der Meulen et al. | ... | 414/805 |

FOREIGN PATENT DOCUMENTS
KR 10-2007-0015749 2/2007
KR 10-2007-0020902 2/2007
* cited by examiner

*Primary Examiner* — Saul Rodriguez
*Assistant Examiner* — Jonathan Snelting
(74) *Attorney, Agent, or Firm* — KED & Associates LLP

(57) ABSTRACT

A substrate processing apparatus includes first and second transfer chambers, first and second load lock chambers for exchanging one or more substrates with respective ones of first and the second transfer chambers, and a substrate transfer unit, located between the first and second load lock chambers, for transferring the one or more substrates to the first and second load lock chambers.

16 Claims, 3 Drawing Sheets

[FIG. 1]
(Prior art)
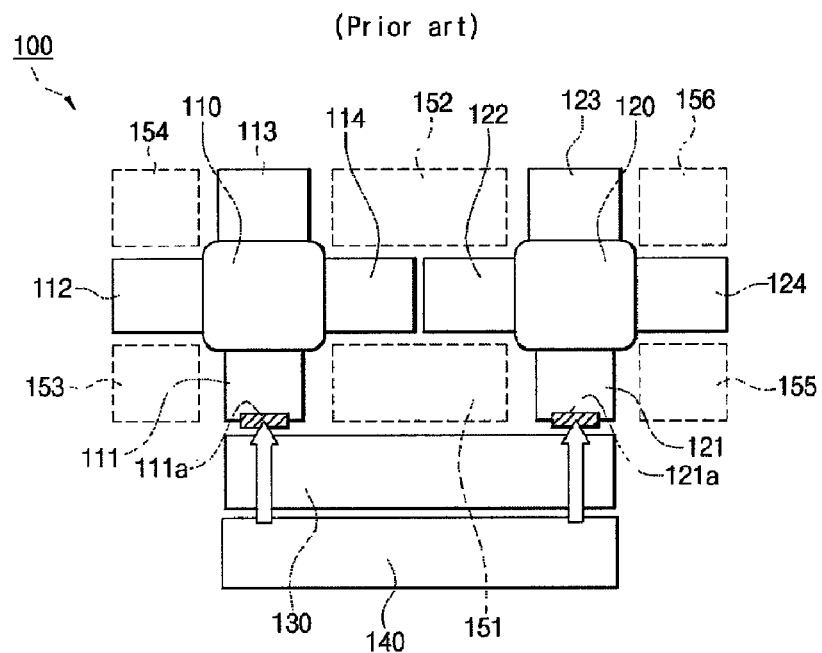
[FIG. 2]
(Prior art)
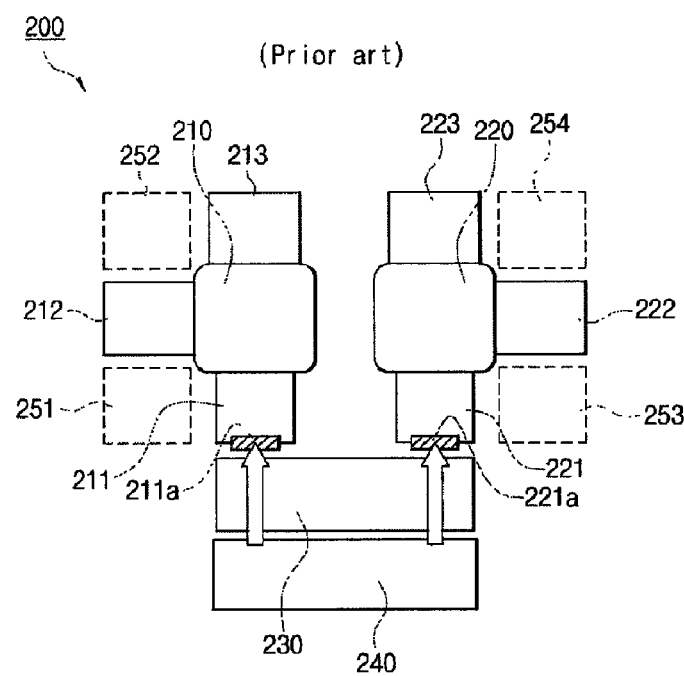

[FIG. 3]
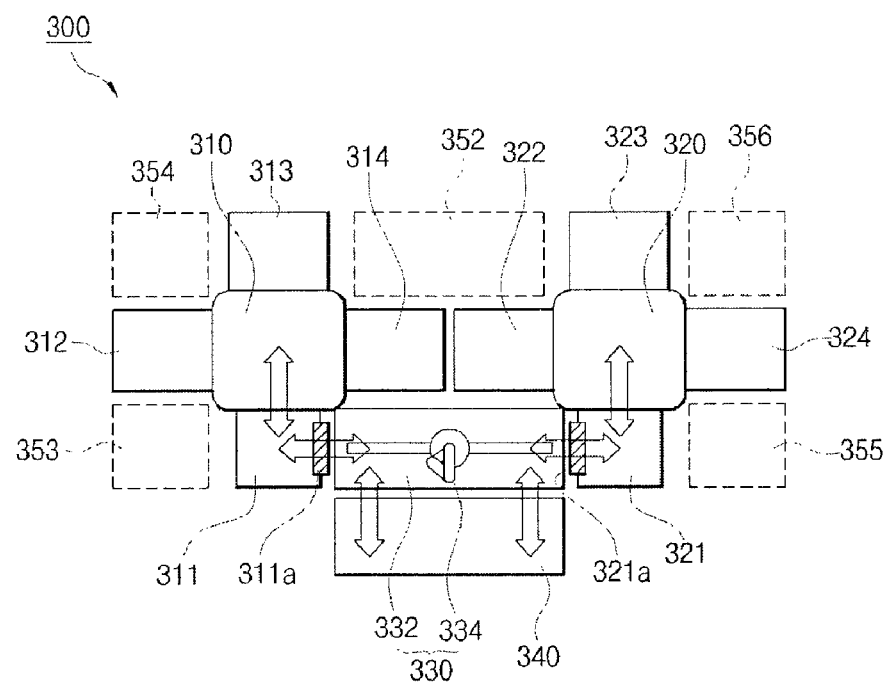
[FIG. 4]
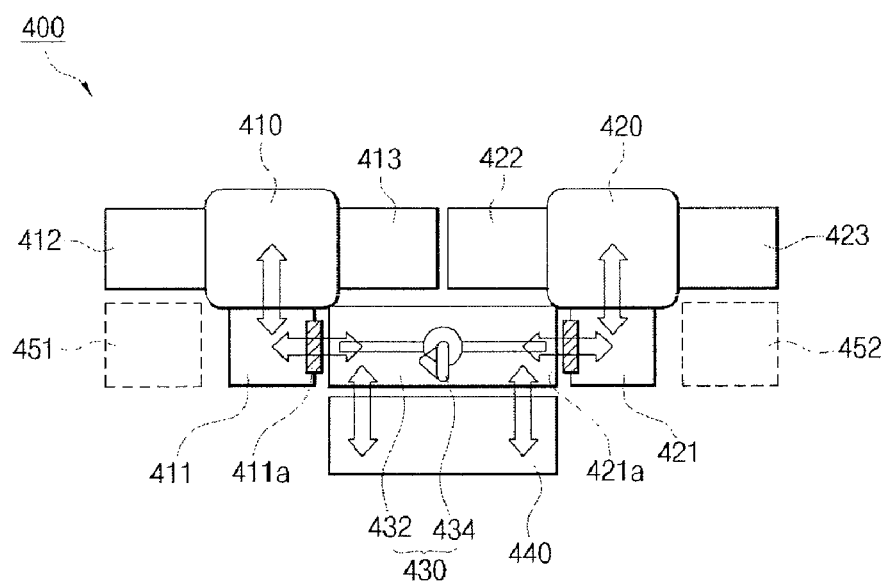

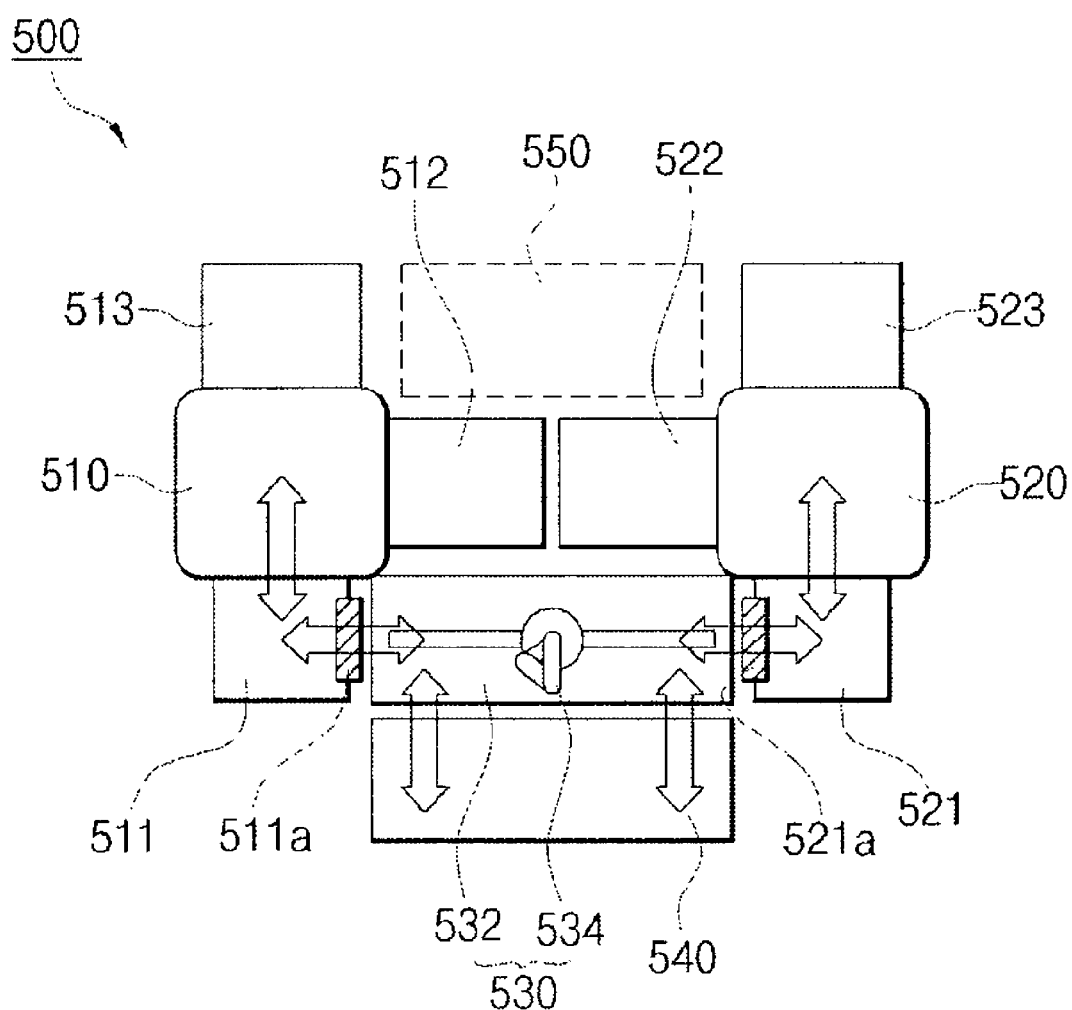
[FIG. 5]

SUBSTRATE PROCESSING APPARATUS

BACKGROUND

1. Field

One or more embodiments described herein relate to processing substrates including semiconductor substrates.

2. Background

Many types of semiconductor components and flat panel displays are manufactured using a plasma processing apparatus. This apparatus performs various processes on a wafer or glass, which generally may be referred to as a substrate. One type of plasma processing apparatus known as a cluster-type apparatus includes process, load lock, and transfer chambers. As presently configured, these chambers and their attendant parts tend to be large in size, inefficiently designed, and therefore undesirable.

BRIEF DESCRIPTION OF THE DRAWINGS

FIGS. 1 and 2 are diagrams showing different types of substrate processing apparatuses.

FIGS. 3 to 5 are diagrams showing other types of substrate processing apparatuses.

DETAILED DESCRIPTION

FIG. 1 shows a cluster type substrate processing apparatus 100 formed by combining two clusters. The first cluster includes a load lock chamber 111 and process chambers 112, 113 and 114 situated around a transfer chamber 110. The second cluster includes a load lock chamber 121 and process chambers 122, 123 and 124 situated around a transfer chamber 120.

The substrate processing apparatus also includes a cassette 140 loaded with a substrate and a substrate transfer robot 130 that transfers the substrate from the cassette to one or both of load lock chambers 111 and 121, or from the load lock chambers to the cassette. The substrate transfer robot is operated under atmospheric pressure differently from a vacuum robot provided in the transfer chambers.

First and second gate valves 111a and 121a are respectively provided at load lock chambers 111 and 121 for transferring one or more substrates using the substrate transfer robot. The first and second gate valves are provided in parallel.

The substrate transfer robot transfers substrates between the cassette and load lock chambers 111 and 121. In the arrangement of FIG. 1, the cassette, substrate transfer robot, gate valves, and load lock chambers are serially arranged. The substrate transfer robot rotates by 180° to exchange the substrates.

In substrate processing apparatus of FIG. 1, there are many unused or inefficiently used spaces. For example, spaces 151 and 152 are used for maintenance and repair but otherwise are ususes. Spaces 153, 154, 155 and 156 are not used at all. These unused or inefficiently used spaces tend to make the substrate processing unnecessarily large.

FIG. 2 shows another type of substrate processing apparatus 200. This apparatus is similar to the apparatus of FIG. 1 except that only two process chambers are provided in each cluster. Like the FIG. 1 apparatus, the apparatus of FIG. 2 has many unused or inefficiently used spaces 251, 252, 253 and 254 which increase the size of the apparatus.

FIG. 3 shows a substrate processing apparatus 300 that is formed by combining first and second clusters. The first cluster includes a first load lock chamber 311 and first process chambers 312, 313 and 314 situated around a first transfer chamber 310. The second cluster includes a second load lock chamber 321 and second process chambers 322, 323 and 324 situated around a second transfer chamber 320.

In addition, the substrate processing apparatus includes a cassette 340 loaded with one or more substrates and substrate transfer unit 330 which transfers substrates from the cassette to load lock chambers 311 and 321, or from the load lock chambers to the cassette. The substrate transfer unit includes a housing 332 and a substrate transfer robot 334 and operates to transfer substrates to the first and second load lock chambers, respectively. The housing 332 is located between and respectively connected to load lock chambers 311 and 312. The substrate transfer robot 334 is provided in the housing to transfer substrates loaded in cassette 340 to the first and second load lock chambers. The robot may transfer a substrate to chamber 321 for processing and then once finished transfer the same substrate from chamber 321 for additional processing, or the robot may transfer different substrates to chambers 311 and 321 for processing in the different clusters.

In addition, first and second gate valves 311a and 321a are provided between housing 332 and first and second load lock chambers 311 and 312 to transfer substrates using the substrate transfer robot 334. The first and second gate valves face each other and the substrate transfer robot is translated between the first and second gate valves 311a and 321a.

In accordance with this arrangement, the moving direction of a substrate between the cassette and substrate transfer robot is basically perpendicular to the moving direction of the substrate between the first and second load lock chambers 311 and 312 and the substrate transfer robot. In addition, the moving directions of the substrate between the first load lock chamber 311 and substrate transfer robot, between the first load lock chamber 311 and first transfer chamber 310, between the second load lock chamber 312 and substrate transfer robot 334, and between the second load lock chamber and second transfer chamber 320 are basically perpendicular to each other. In other words, substrate transfer robot 334 is arranged in terms of its movement to be perpendicular to the operational orientations of cassette 340 and load lock chambers 311 and 321.

In substrate transfer apparatus 300, space utilization is maximized by providing substrate transfer robot 334 in an intervening space between load lock chambers 311 and 321. This intervening space may be considered to be a remnant space (e.g., space 151 in FIG. 1) that is unused or inefficiently used in other substrate transfer apparatuses. By making efficient use of this space during processing, the size or footprint of the substrate processing apparatus of FIG. 3 may be reduced and therefore may be considered to be more efficient in terms of work space.

FIG. 4 shows another type of substrate processing apparatus 400 which is similar to the apparatus of FIG. 3 except that only two process chambers are provided in each cluster. That is, similar to the apparatus of FIG. 3, first and second gate valves 411a and 421a of load lock chambers 411 and 421 are provided to face each other and space utilization is maximized by providing a substrate transfer robot 430 in an intervening (e.g., remnant or unused) space between the first and second load lock chambers. The substrate transfer robot is arranged to be perpendicular to cassette 440 and the load lock chambers.

In this embodiment, the number of remnant or unused spaces 451 and 452 is significantly reduced compared, for example, to the apparatus of FIG. 2 which also uses only two process chambers per cluster. Also, first and second process chambers 413 and 422 are arranged in parallel with housing 432, and first and second process chambers 412 and 423 are provided at opposite sides to first and second process chambers 413 and 422.

FIG. 5 shows another substrate processing apparatus 500 that includes two process chambers in each cluster. In this apparatus, two process chambers are provided perpendicular to each other in each cluster, which is different from the apparatus of FIG. 4 where the angle between the process chambers in each cluster (412 and 413, 422 and 423) is 180°.

Also, in apparatus 500, first and second gate valves 511a and 521a of load lock chambers 511 and 521 are provided to face each other and space utilization is maximized by providing substrate transfer robot 530 in an intervening (e.g., unused or remnant) space between the first and second load lock chambers. The substrate transfer robot is arranged perpendicular to cassette 540 and the load lock chambers. In this embodiment, a remnant space 550 still exists but the number of unused or inefficiently used spaces is significantly reduced compared with other apparatuses.

Thus, substrate processing apparatuses in accordance with the foregoing embodiments are implemented with a reduced size or footprint compared with other apparatuses. This results from a more efficient use of space during processing, which translates into a reduction in the overall work space required for substrate processing. These embodiments may also optimize the locations of gate valves in the load lock chambers and the location of the substrate transfer robot.

One or more embodiments specifically correspond to a cluster-type substrate processing apparatus having a reduced footprint achieved by optimizing the locations of gate valves in the load lock chamber, as well as the location and arrangement of a substrate transfer robot used in this apparatus.

In accordance with one embodiment, a substrate processing apparatus comprises a first cluster including a first transfer chamber, a first load lock chamber and a first process chamber provided around the first transfer chamber; a second cluster including a second transfer chamber, a second load lock chamber and a second process chamber provided around the second transfer chamber; a cassette loaded with a substrate; and a substrate transfer robot for exchanging the substrates between the first and second load lock chambers and cassette, where first and second gate valves are respectively provided at one sides of the first and second load lock chambers to transfer the substrate by using the substrate transfer robot, and the first and second gate valves are provided to face each other.

The substrate transfer robot may be provided to be horizontally movable between the first and second gate valves. The substrate transfer robot may be arranged in perpendicular to the cassette and load lock chamber. In addition, the first or second cluster may include two or three process chambers around the transfer chamber.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A substrate processing apparatus, comprising:
a first cluster including a first transfer chamber to transfer one or more substrates to at least one first process chamber;
a second cluster including a second transfer chamber, spaced from the first transfer chamber, to transfer one or more substrates to at least one second process chamber;
a first load lock chamber, coupled to the first transfer chamber, to transfer one or more substrates from/to the first load lock chamber to/from the first process chamber;
a second load lock chamber, coupled to the second transfer chamber, to transfer one or more substrates from/to the second load lock chamber to/from the second process chamber, the second load lock chamber spaced from the first load lock chamber;
a substrate transfer unit, located between the first and second load lock chambers, for transferring the one or more substrates to the first and second load lock chambers; and
a cassette provided at a rear of the substrate transfer unit, wherein:
the substrate transfer unit and the first and second load lock chambers are aligned along a common axis,
the substrate transfer unit receives the one or more substrates directly from the cassette with no intervening load lock chamber,
the substrate transfer unit includes a robot to transfer substrates between the cassette and each of the first and second load lock chambers,
the robot moves linearly in a first direction between the first and second load lock chambers in alignment with the first and second load lock chambers along said common axis,
the one or more substrates move linearly in a second direction between each of the first and second load lock chambers and respective ones of the first and second clusters, and wherein the first direction crosses the second direction.

2. The apparatus of claim 1, further comprising:
a housing between the first and second load lock chambers;
a first gate valve between a first side of the housing and the first load lock chamber; and
a second gate valve between a second side of the housing and the second load lock chamber, wherein the first and second gate valves are linearly aligned and wherein the robot transfers the one or more substrates to the first and second load lock chambers through respective ones of the first and second gate valves.

3. The apparatus of claim 2, wherein the robot moves along a linear path between the first and second gate valves.

4. The apparatus of claim 2, wherein the first gate valve faces the first side of the housing and the second gate valve faces the second side of the housing.

5. The apparatus of claim 1, wherein the one or more substrates are transferred from the cassette to the robot along a path that is at least substantially perpendicular to a path along which the robot moves between the first and second load lock chambers.

6. The apparatus of claim 1, wherein the one or more substrates are transferred between the first load lock chamber and the robot along a first path, between the first load lock chamber and the first transfer chamber along a second path, between the second load lock chamber and the robot along a third path, and between the second load lock chamber and second transfer chamber along a fourth path, and wherein the first and third paths are substantially perpendicular to the second and fourth paths.

7. The apparatus of claim 1, further comprising:
    at least two first process chambers coupled to the first transfer chamber, and at least two second process chambers coupled to the second transfer chamber.

8. The apparatus of claim 7, wherein an arrangement of the first process chambers and an arrangement of the second process chambers are in symmetry.

9. The apparatus of claim 7, wherein the first of process chambers are arranged equiangular to each other and the second of process chambers are arranged equiangular to each other.

10. The apparatus of claim 1, wherein the cassette is disposed adjacent to the substrate transfer unit and a longitudinal side of the cassette is substantially parallel with a longitudinal side of the substrate transfer unit.

11. The apparatus of claim 1, wherein the cassette is not included in a load lock chamber.

12. The apparatus of claim 1, wherein the first load lock chamber and the second load lock chamber are the only load lock chambers.

13. The apparatus of claim 1, wherein:
    the at least one first process chamber has a first opening for receiving the one or more substrates from the first transfer chamber, and
    the first opening is the only opening through which substrates pass into and out of the at least one first process chamber.

14. The apparatus of claim 13, wherein:
    the at least one second process chamber has a second opening for receiving the one or more substrates from the second transfer chamber, and
    the second opening is the only opening through which substrates pass into and out of the at least one second process chamber.

15. The apparatus of claim 1, wherein the first direction is substantially perpendicular to the second direction.

16. The apparatus of claim 1, wherein the cassette is located outside any load lock chamber.

* * * * *